United States Patent
Kosaka

(10) Patent No.: US 9,986,665 B2
(45) Date of Patent: May 29, 2018

(54) POWER CONVERSION APPARATUS

(71) Applicant: DENSO CORPORATION, Kariya, Aichi-pref. (JP)

(72) Inventor: Kazuhiro Kosaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/382,802

(22) Filed: Dec. 19, 2016

(65) Prior Publication Data

US 2017/0181333 A1  Jun. 22, 2017

(30) Foreign Application Priority Data

Dec. 17, 2015 (JP) .................................. 2015-246440

(51) Int. Cl.
*H05K 7/20* (2006.01)
*H02M 7/00* (2006.01)
*H02M 7/537* (2006.01)

(52) U.S. Cl.
CPC ........ *H05K 7/20927* (2013.01); *H02M 7/003* (2013.01); *H02M 7/537* (2013.01); *H05K 7/209* (2013.01); *H05K 7/20254* (2013.01); *H05K 7/20263* (2013.01)

(58) Field of Classification Search
None
See application file for complete search history.

(56) References Cited

U.S. PATENT DOCUMENTS

| 5,631,821 | A * | 5/1997 | Muso | H05K 7/20927 361/709 |
| 7,200,007 | B2 * | 4/2007 | Yasui | H02M 7/003 165/80.4 |
| 8,159,823 | B2 * | 4/2012 | Murakami | H01L 23/473 180/243 |
| 8,325,479 | B2 * | 12/2012 | Siracki | H05K 7/20918 361/678 |
| 9,596,791 | B2 * | 3/2017 | Sakuma | H05K 7/202 |
| 2007/0076355 | A1 * | 4/2007 | Oohama | H01L 25/117 361/676 |

(Continued)

FOREIGN PATENT DOCUMENTS

JP 2015-073401 A 4/2015

*Primary Examiner* — Courtney Smith
(74) *Attorney, Agent, or Firm* — Oliff PLC

(57) ABSTRACT

A power conversion apparatus includes a first power converter, second power converter, a case, and partitioning portion. The first power converter performs power conversion. The second power converter performs power conversion. The case houses the first power converter and the second power converter. The partitioning portion partitions the first power converter and the second power converter housed in the case, and forms a coolant flow passage through which a coolant flows. The first power converter includes a first heat-generating component. The second power converter includes a second heat-generating component. The first heat-generating component and the second heat-generating component are each joined to the partitioning portion at a position at which the first heat-generating component and the second heat-generating component do not overlap each other in a perpendicular direction perpendicular to a coolant flow direction of the coolant flow passage.

9 Claims, 11 Drawing Sheets

(56) References Cited

U.S. PATENT DOCUMENTS

| | | | |
|---|---|---|---|
| 2008/0174393 A1* | 7/2008 | Schnetzka | F25B 49/025 336/57 |
| 2012/0250252 A1* | 10/2012 | Iguchi | H05K 7/20927 361/689 |
| 2015/0222196 A1* | 8/2015 | Tokuyama | H01L 23/36 363/131 |
| 2016/0192540 A1* | 6/2016 | Riedel | H02M 7/003 361/699 |

* cited by examiner

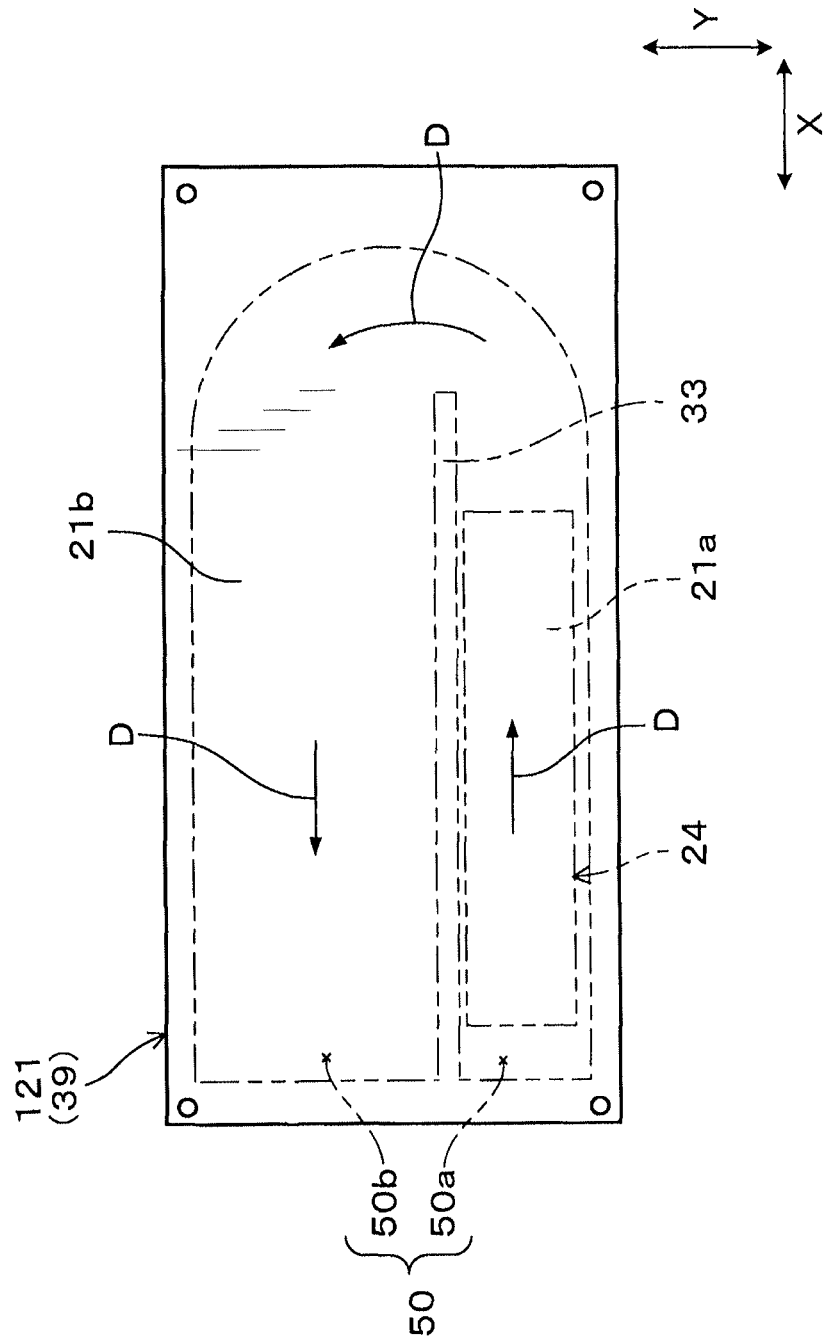

POWER CONVERSION APPARATUS

CROSS-REFERENCE TO RELATED APPLICATION

This application is based on and claims the benefit of priority from Japanese Patent Application No. 2015-246440, filed Dec. 17, 2015. The entire disclosure of the above application is incorporated herein by reference.

BACKGROUND

Technical Field

The present disclosure relates to a power conversion apparatus that includes a power converter.

Related Art

A power converter is mounted in a vehicle, such as an electric car or a hybrid car. The power converter is an inverter, a converter, or the like. The inverter converts direct-current power to alternating-current power. The converter converts direct-current power to direct-current power of a differing voltage. For example, JP-A-2015-073401 discloses a power conversion apparatus in which an inverter and a converter are housed in a housing that serves as a case.

The power converter, such as an inverter or a converter, includes a heat-generating component, such as a transistor or a reactor, that generates a large amount of heat. Here, the power conversion apparatus is configured such that a coolant (refrigerant) flow passage is formed by a partitioning portion and a base plate of the case. The partitioning portion partitions two power converters. The base plate is in contact with the partitioning portion. In addition, the power conversion apparatus is configured such that the heat-generating component configuring either of the power converters is joined to the base plate. In the present configuration, heat generated by the heat-generating component is transferred to a coolant through the base plate and the partitioning portion, and the heat-generating component is thereby cooled.

In the power conversion apparatus in JP-A-2015-073401, a following configuration can be used to cool both of the two power converters. That is, the heat-generating component of each power converter can be joined to the partitioning portion, the base plate that is contact with the partitioning portion, or the like. When a configuration such as this is used, the occurrence of a phenomenon in which the heat generated by the respective heat-generating components of the power converters interfere with each other through the coolant is preferably suppressed to the greatest possible extent, in order to improve cooling performance of the power converter.

SUMMARY

It is thus desired to provide a power conversion apparatus that is capable of improving cooling performance of both of two power converters that are partitioned by a partitioning portion.

An exemplary embodiment of the present disclosure provides a power conversion apparatus including: a first power converter that performs power conversion; a second power converter that performs power conversion; a case that houses the first power converter and the second power converter; and a partitioning portion that partitions the first power converter and the second power converter housed in the case, the partitioning portion forming a coolant flow passage through which a coolant flows. The first power converter includes a first heat-generating component. The second power converter includes a second heat-generating component. The first heat-generating component and the second heat-generating component are joined to the partitioning portion at a position at which the first heat-generating component and the second heat-generating component do not overlap each other in a perpendicular direction perpendicular to a coolant flow direction of the coolant flow passage.

In the above-described power conversion apparatus, the first heat-generating component of the first power converter is in contact with the partitioning portion. Therefore, heat generated by the first heat-generating component is transmitted to the coolant flowing through the coolant flow passage. In a similar manner, the second heat-generating component of the second power converter is in contact with the partitioning portion. Therefore, heat generated by the second heat-generating component is transmitted to the coolant flowing through the coolant flow passage. At this time, the first heat-generating component and the second heat-generating component are positioned so as not to overlap each other in the perpendicular direction perpendicular to the coolant flow direction of the coolant flow passage. Therefore, occurrence of a phenomenon in which heat generated by each heat-generating component interferes with the other through the coolant can be suppressed. That is, heat flowing into a coolant of a fixed volume, simultaneously from both sides in the direction perpendicular to the coolant flow direction, can be suppressed. As a result, heat transfer from the heat-generating components to the coolant is not easily limited, and cooling performance is improved.

As described above, according to the above-described exemplary embodiment, respective heat-generating components of the two power converters are joined to the partitioning portion in positions that are offset so as not to overlap each other in the perpendicular direction. Consequently, cooling performances of both of the two power converters can be improved.

BRIEF DESCRIPTION OF THE DRAWINGS

In the accompanying drawings:

FIG. 11 is a planar view of a base plate corresponding to the partition wall in FIG. 10.

DESCRIPTION OF THE EMBODIMENTS

Figure 1:
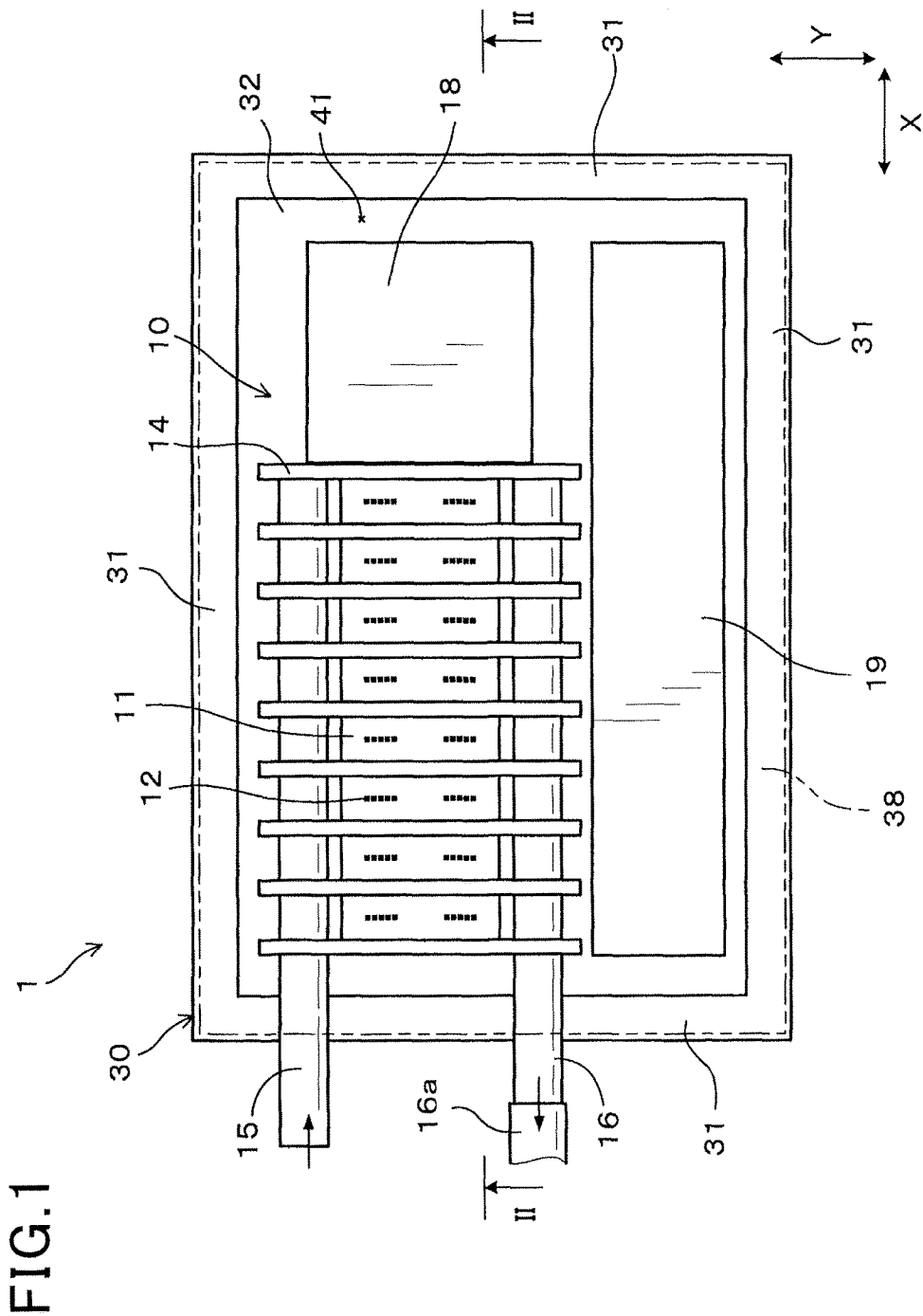
FIG. 1 is a diagram of an overview of a power conversion apparatus according to an embodiment.

A power conversion apparatus according to an embodiment will hereinafter be described with reference to the drawings.

Unless otherwise noted, in the drawings of the present specification, a first direction that is a length direction (vertical direction) of a case housing a power converter is indicated by arrow X. A second direction that is a lateral direction of the case is indicated by arrow Y. A third direction perpendicular to both the first direction and the second direction is indicated by arrow Z.

Figure 2:
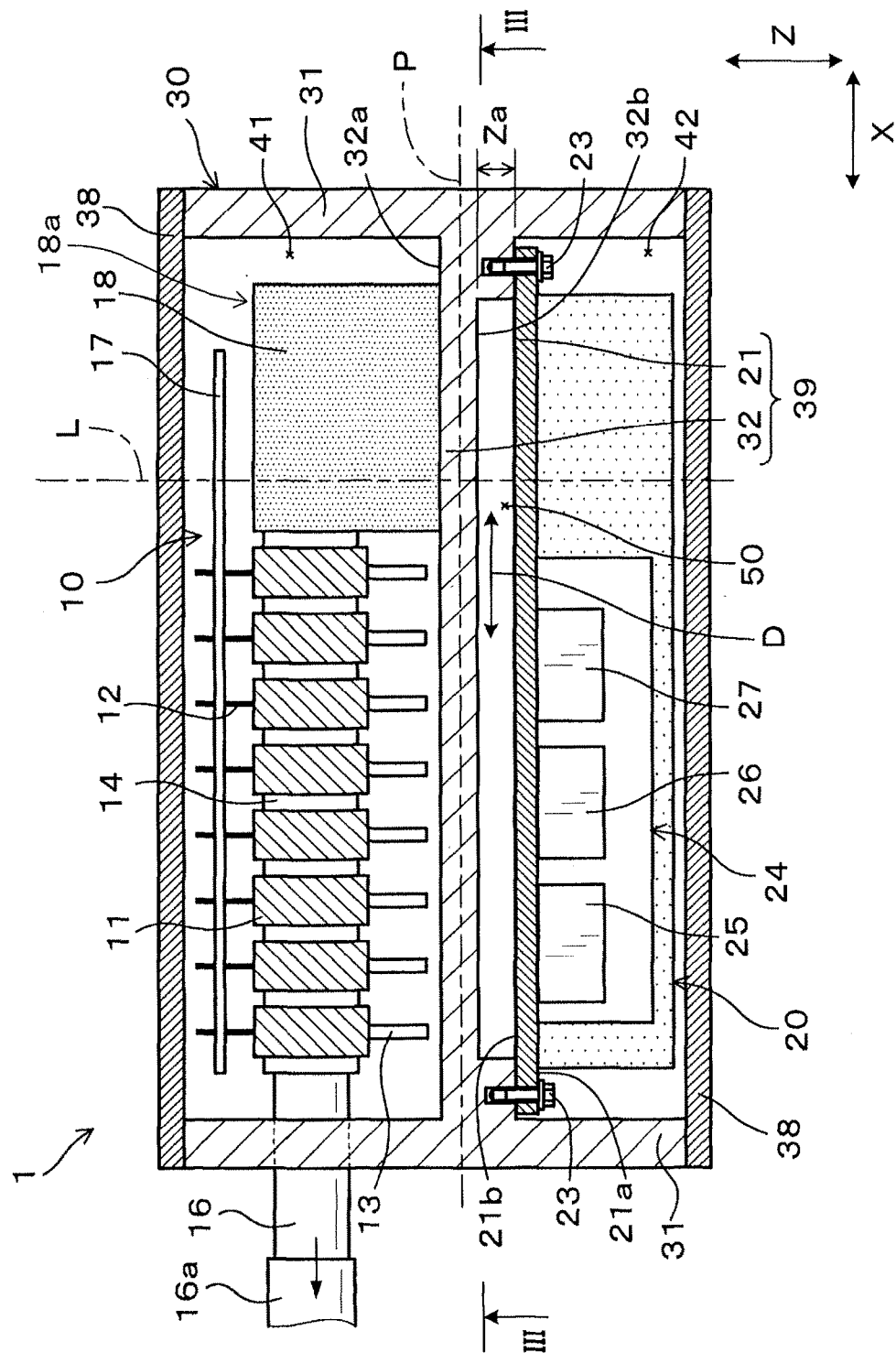
FIG. 2 is a cross-sectional view taken along line II-II in FIG. 1.

As shown in FIGS. 1 and 2, a power conversion apparatus 1 according to the present embodiment includes a first power converter 10, a second power converter 20, and a case 30.

The first power converter 10 is an inverter that converts direct-current power to alternating-current power. Hereafter, the first power converter 10 is also referred to as an inverter 10. The second power converter 20 is a converter that converts direct-current power to direct-current power of a differing voltage. Hereafter, the second power converter 20 is also referred to as a converter 20. The inverter 10 and the converter 20 are both devices that perform power conversion. The power conversion apparatus 1 is suitable for mounting in a vehicle, such as an electric car or a hybrid car, through combination of the inverter 10 and the converter 20.

The case 30 is a box-shaped component that houses the inverter 10, the converter 20, and a plurality of other electronic components. The case 30 includes four side-wall portions 31 and a partition wall 32. The partition wall 32 partitions an interior space surrounded by the four side-wall portions 31. The case 30 is an automobile component that is required to be lightweight and have high dimensional accuracy. The case 30 is typically composed of an aluminum material and fabricated by an aluminum die casting method.

The partition wall 32 is configured as a portion of the case 30. The partition wall 32 is a plate-shaped section that extends along a plane (a plane prescribed by both the first direction X and the second direction Y) that is perpendicular to all four side-wall portions 31. As a result, the cross-sectional shape of the case 30 is substantially H-shaped.

The inverter 10 includes a laminated body in which a plurality of semiconductor modules 11 and a plurality of cooling tubes (cooling portions) 14 are alternately laminated in the first direction X. The semiconductor module 11 includes therein a semiconductor element. A coolant (refrigerant) that cools the semiconductor modules 11 flow through the cooling tubes 14. The semiconductor module 11 is sandwiched from both sides by the cooling tubes 14. The semiconductor module 11 includes therein a switching element, such as an insulated-gate bipolar transistor (IGBT), and a diode, such as a freewheeling diode (FWD).

Respective inflow portions of the plurality of cooling tubes 14 are connected to a coolant supply header 15 that supplies coolant from outside. In addition, respective outflow portions of the plurality of cooling tubes 14 are connected to a coolant discharge header 16 that discharges the coolant outside. Therefore, the coolant that flows from the coolant supply header 15 into the inflow portion of the cooling tube 14 cools the semiconductor modules 11 positioned on both sides of the coolant pipe 14 in the first direction X when the coolant flows through the coolant flow passage within the cooling tube 14. The coolant is then discharged from the outflow portion of the cooling tube 14 to the coolant discharge header 16.

As the coolant that is sent through the cooling tubes 14, for example, a natural coolant such as water or ammonia, water mixed with an ethylene glycol-based antifreezing solution, a fluorocarbon-based refrigerant such as Fluorinert (registered trademark), a chlorofluorocarbon-based refrigerant such as HCFC-123 (2,2-dichloro-1,1,1-trifluoroethane) or HFC-134a (1,1,1,2-tetrafluoroethane), an alcohol-based refrigerant such as methanol or alcohol, or a ketone-based refrigerant such as acetone can be used.

The semiconductor module 11 includes a control terminal 12 and an electrode terminal 13. The control terminal 12 is connected to a control circuit board 17. The electrode terminal 13 is connected to a metal bus bar (not shown). A control current for controlling the switching element of the semiconductor module 11 is inputted to the semiconductor module 11 through the control terminal 12. Controlled power of the semiconductor module 11 is inputted to and outputted from the semiconductor module 11 through the electrode terminal 13.

The inverter 10 further includes a reactor 18, a capacitor 19, and the like that are elements configuring an inverter circuit 10a, described hereafter. The reactor 18 configures a portion of a voltage boosting circuit for boosting input voltage inputted to the semiconductor module 11. The reactor 18 is a converter that converts electrical energy to magnetic energy. The capacitor 19 is configured as a smoothing capacitor that smoothes the input voltage or the stepped-up voltage.

As shown in FIG. 2, the reactor 18 is housed in a first space 41 so as to be disposed adjacent to the plurality of semiconductor modules 11 on one side in the first direction X. As shown in FIG. 1, the capacitor 19 is housed in the first space 41 so as to be disposed side by side relative to the plurality of semiconductor modules 11 and the reactor 18.

As shown in FIG. 2, a partitioning potion 39 is composed of the plate-shaped partition wall 32 of the case 30 and a plate-shaped base plate 21. The base plate 21 configures an attachment surface for the converter 20. The partitioning portion 39 partitions the interior space of the case 30 into the first space 41 and a second space 42. The first space 41 houses at least the inverter 10. The second space 42 houses at least the converter 20. The first space 41 and the second space 42 are both covered by a cover 38. Therefore, the partitioning portion 39 is configured to partition the inverter 10 and the converter 20 that are housed in the case 30.

The partitioning portion 39 forms a coolant flow passage 50 through which the coolant flows, as a result of a recessing portion of the partition wall 32 being covered by the base plate 21. That is, in the partitioning portion 39, the partition wall 32 and the base plate 21 are disposed so as to be substantially parallel to each other on both sides across the coolant flow passage 50 in the third direction Z. When the partition wall 32 is a first partition wall, the base plate 21 serves as a second partition wall. The partitioning portion 39 extends along the extending surfaces of the partition wall 32 and the base plate 21. As a result of the configuration in which the recessing portion of the partition wall 32 is covered by the base plate 21, the partitioning portion 39 that has the coolant flow passage 50 can be constructed with relative ease.

The base plate 21 is composed of an aluminum material similar to that of the case 30. The base plate 21 is fixed to the case 30 by fastening bolts 23 in a state in which the base plate 21 is in contact with the partition wall 32 via a sealing member (not shown), such as a liquid gasket or rubber. As a result, air-tightness of the coolant flow passage 50 is ensured. The coolant flow passage 50 is configured such that a flow passage height Za in the third direction Z is substantially fixed.

The partition wall 32 has a heat-receiving surface 32a and a heat-releasing surface 32b. The heat-receiving surface 32a faces the first space 41 that houses the inverter 10. The reactor 18 (also referred to as a first heat-generating component 18a) is joined to the heat-receiving surface 32a. The reactor 18 is a heat-generating component of the inverter 10 and generates a larger amount of heat than other components. That is, the first heat-generating component 18a is in contact with the heat-receiving surface 32a of the partition wall 32. The heat-receiving surface 32a is configured as a joining surface for the first heat-generating component 18a. The heat-releasing surface 32b is a surface, of the two surfaces of the partition wall 32, on the side opposite the heat-receiving surface 32a. The heat-releasing surface 32b is configured as a bottom surface of the recessing portion of the partition wall 32. The heat-releasing surface 32b partitions the coolant flow passage 50 and is in contact, at all times, with the coolant flowing in a coolant flow direction D in the coolant flow passage 50.

The base plate 21 has a heat-receiving surface 21a and the heat-releasing surface 21b. A second heat-generating component 24 configuring the converter 20 is joined to the heat-receiving surface 21a. That is, the second heat-generating component 24 is in contact with the heat-receiving surface 21a of the base plate 21. The heat-receiving surface 21a is configured as a joining surface for the second heat-generating component 24. The second heat-generating component 24 includes a transistor 25, a choke coil 26, and a filter capacitor 27 that generate a larger amount of heat than other components. The transistor 25 functions to step down direct-current power. The choke coil 26 removes ripple currents from the direct-current power that has been stepped down by the transistor 25. The filter capacitor 27 removes noise voltage from the direct-current power that has been stepped down by the transistor 25. The heat-releasing surface 21b is a surface, of the two surfaces of the base plate 21, on the side opposite the heat-receiving surface 21a. The heat-releasing surface 21b partitions the coolant flow passage 50 and is in contact, at all times, with the coolant flowing in the coolant flow direction D in the coolant flow passage 50.

The first heat-generating component 18a and the second heat-generating component 24 are each joined to the partitioning portion 39 at a position at which the first heat-generating component 18a and the second heat-generating component 24 do not overlap each other in the third direction Z (also referred to, hereafter, as a perpendicular direction Z) that is perpendicular to the coolant flow direction D of the coolant flow passage 50. In other words, the first heat-generating component 18a and the second heat-generating component 24 are each joined to the partitioning portion 39 in positions that are offset from each other in the coolant flow direction D. Alternatively, the first heat-generating component 18a and the second heat-generating component 24 are each joined to the partitioning portion 39 in positions so as not to overlap each other when viewed from one side to the other in the third direction Z. In this case, the perpendicular direction Z is also defined as a normal direction (perpendicular direction) in relation to the joining surface (the heat-receiving surface 32a of the partition wall 32 and the heat-receiving surface 21a of the base plate 21) of the partitioning portion 39, or a normal direction (perpendicular direction) in relation to a virtual plane P that runs along the coolant flow passage 50.

Figure 3:
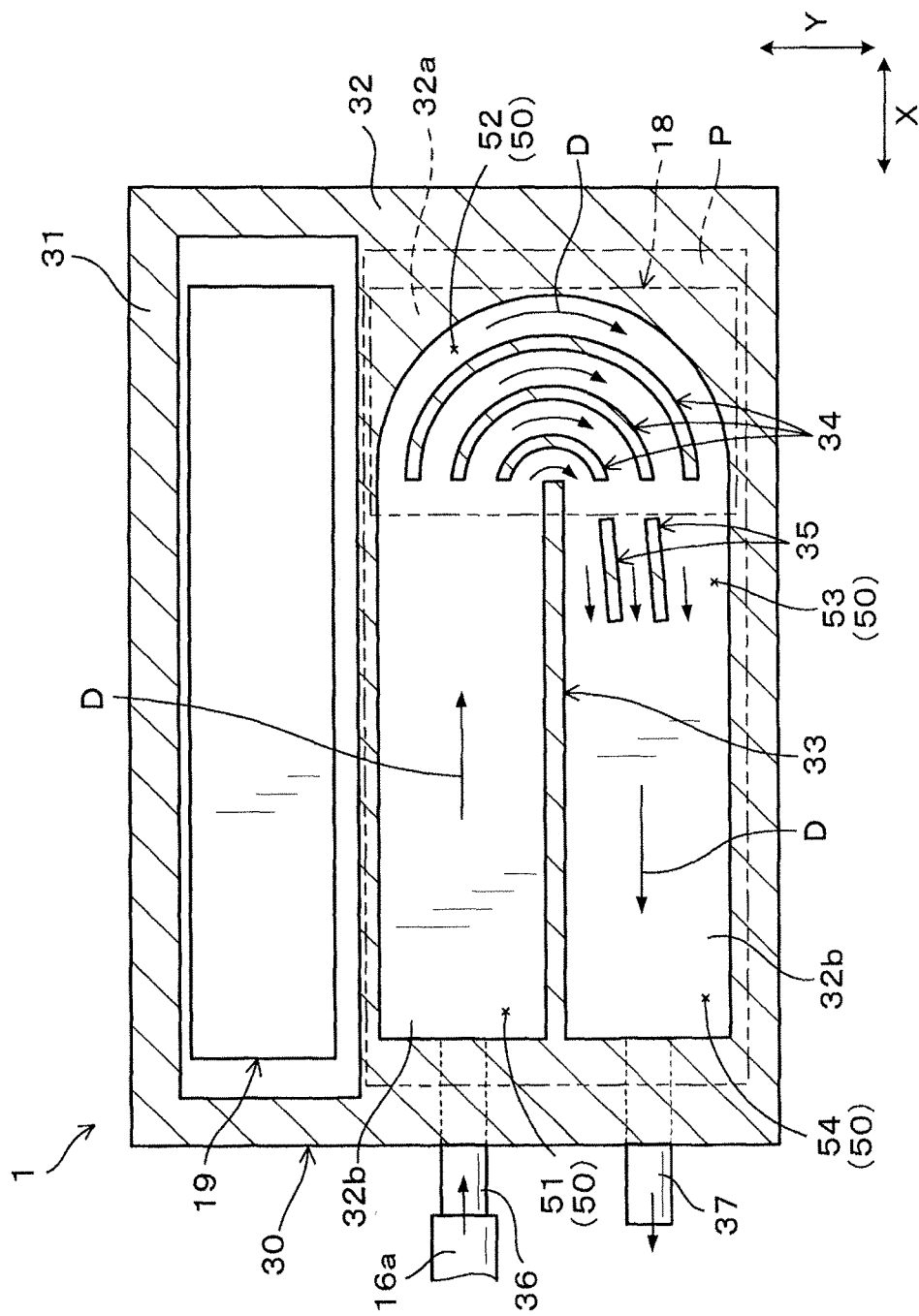
FIG. 3 is a cross-sectional view taken along line in FIG. 2.

As shown in FIG. 3, a coolant supply tube 36 is connected to the above-described coolant discharge header 16 via a connecting tube 16a. According to the present embodiment, the coolant used to cool the semiconductor modules 11 is directly used in the coolant flow passage 50. The coolant flow passage 50 can also be separated from the coolant flow passage of the semiconductor modules 11, as required.

Figure 4:
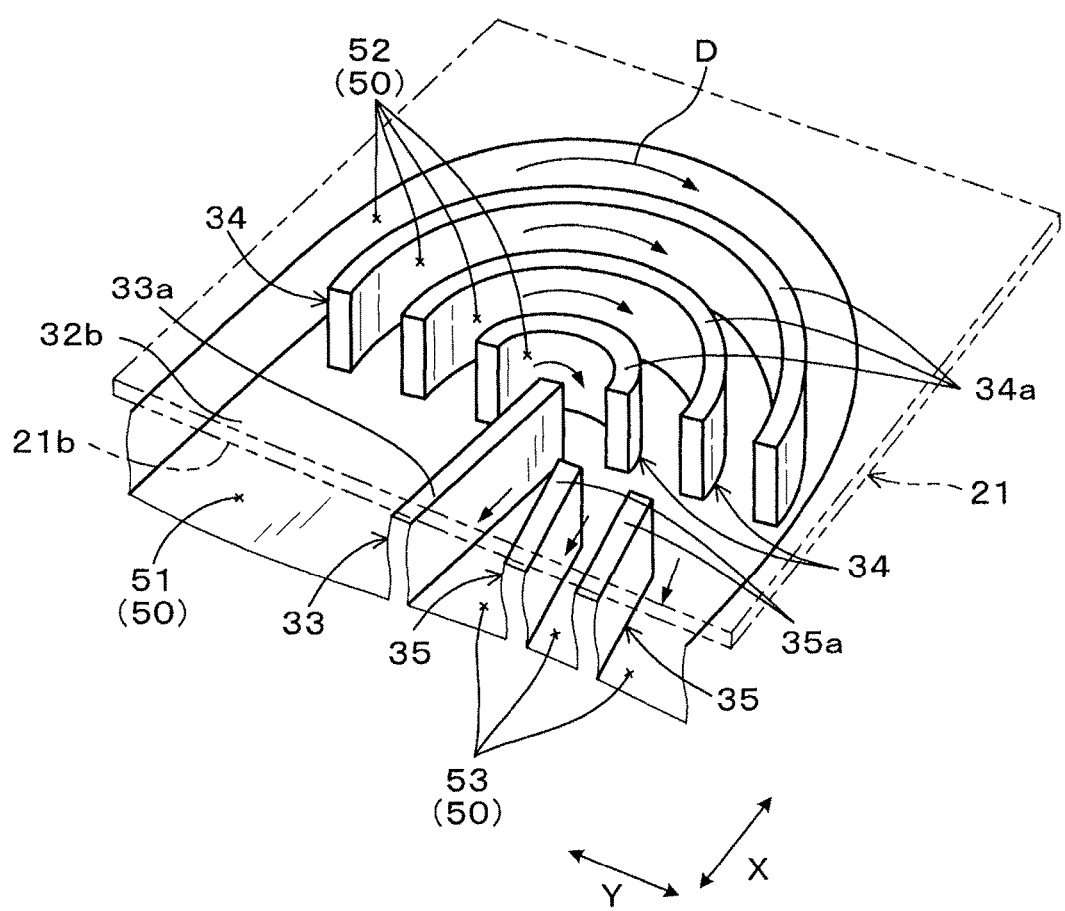
FIG. 4 is a perspective view of first heat-releasing fins and rectifying fins provided in a partition wall in FIG. 3.

As shown in FIGS. 3 and 4, the partition wall 32 is provided with a standing portion 33 to form the coolant flow passage 50. The standing portion 33 is vertically disposed from a center position of the heat-releasing surface 32b in the second direction Y towards the base plate 21, and extends in an elongated shape in the first direction X. As a result, the coolant flow passage 50 is configured such that the coolant that flows in from the coolant supply tube 36 flows through a half area on one side of the standing portion 33, makes a U-turn, and flows through the remaining half area on the other side. The coolant is then discharged outside from a coolant discharge tube 37. In the present configuration, there is a single U-turn point. A tip end portion 33a of the standing portion 33 is in contact with the heat-releasing surface 21b of the base plate 21 with no gap therebetween. The standing portion 33 has a standing height that is similar to the flow passage height Za of the coolant flow passage 50.

The coolant flow passage 50 is configured as a flow passage that includes a first segment 51, a second segment 52, a third segment 53, and a fourth segment 54 that are arranged in order from an upstream side. The first segment 51 is a segment in which the coolant linearly flows towards one side in the first direction X. The second segment 52 is a segment in which the coolant flows so as to make a U-turn from the one side in the first direction X to the other side. The third segment 53 and the fourth segment 54 are both segments in which the coolant linearly flows in the direction opposite that of the first segment 51. Therefore, the coolant flow passage 50 is a turning flow passage that is configured such that the direction of the flow passage changes. As a result, compared to a coolant flow passage that is linearly formed without change in the direction of the flow passage, the flow passage can be extended and a high coolant flow rate can be set.

The partition wall 32 includes a plurality of first heat-releasing fins 34 (e.g., three first heat-releasing fins 34, according to the present embodiment) in an area corresponding to the second segment 52 of the coolant flow passage 50. The first heat-releasing fin 34 extends towards the coolant flow passage 50 from a position on the heat-releasing surface 32b opposing the coolant flow passage 50 that passes through the first heat-generating component 18a in the perpendicular direction Z, that is, a position directly under the first heat-generating component 18a. In addition, an extending tip end portion 34a of the first heat-releasing fin 34 is in contact with the heat-releasing surface 21b of the base plate 21 with no gap therebetween. In this case, the first heat-releasing fin 34 has a standing height that is similar to the flow passage height Za of the coolant flow passage 50.

The first heat-releasing fin 34 is formed into a curved plate shape that has a uniform plate thickness and extends along the coolant flow direction D. The first heat-releasing fin 34 functions to increase contact area (heat-release area of the heat-releasing surface 32b directly under the first heat-generating component 18a) between the partition wall 32 and the coolant. In addition, in the second segment 52, the flow passage is narrowed by an amount equivalent to the plate thicknesses of the three first heat-releasing fins 34. Therefore, the first heat-releasing fin 34 functions to increase the flow rate of the coolant. As a result of these functions, the amount of heat released from the partition wall 32 can be increased. Furthermore, the first heat-releasing fin 34 extends along the coolant flow direction D. Therefore, the first heat release fin 34 functions to keep flow passage resistance applied to the coolant low. As a result of this function, the coolant can be smoothly supplied while rectifying the flow. A single or a plurality of first heat-releasing fins 34 may be provided.

The partition wall 32 includes a plurality of rectifying fins 35 (e.g., two rectifying fins 35, according to the present embodiment) in an area corresponding to the third segment 53 of the coolant flow passage 50. The rectifying fin 35 extends from the heat-releasing surface 32b towards the base plate 21. An extending tip end portion 35a of the rectifying fin 35 is in contact with the heat-releasing surface 21b of the base plate 21.

The rectifying fin 35 functions to prevent the formation of air pockets in the coolant flow passage 50 by rectifying the coolant flow, as well as increasing contact area with the coolant in a manner similar to the first heat-releasing fin 34. A single or a plurality of rectifying fins 35 may be provided. Alternatively, when the necessity for rectification of the coolant flow is low, the rectifying fin 35 may be omitted.

Figure 5:
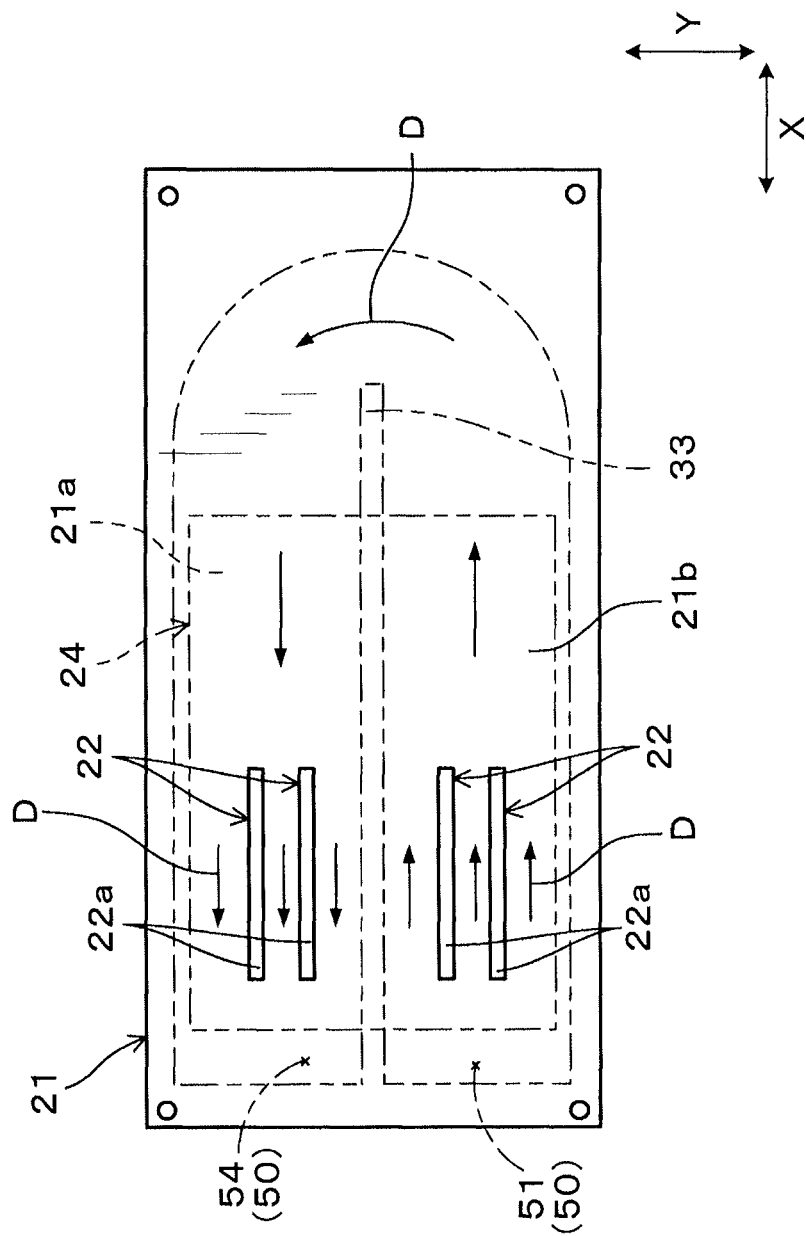
FIG. 5 is a planar view of a base plate in FIG. 2, viewed from a coolant flow passage side.
Figure 6:
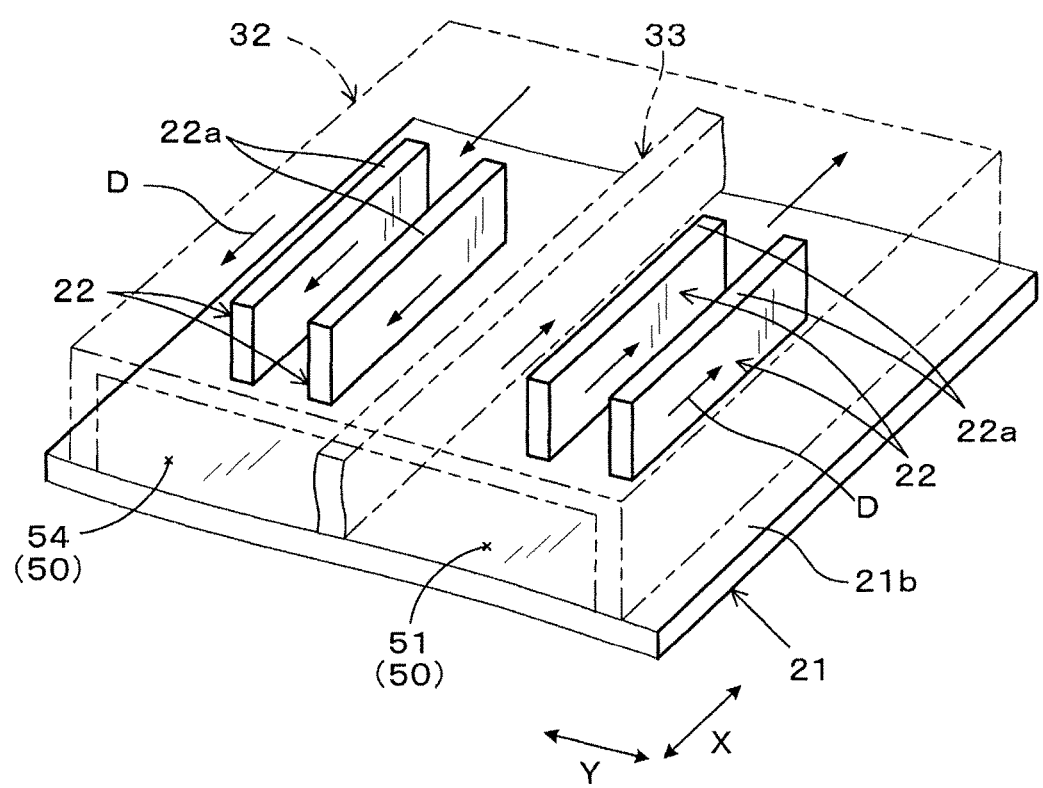
FIG. 6 is a perspective view of second heat-releasing fins provided in the base plate in FIG. 5.

As shown in FIGS. 5 and 6, the partition wall 32 includes a plurality of second heat-releasing fins 22 (e.g., two second heat-releasing fins 22, according to the present embodiment) in areas corresponding to the first segment 51 and the fourth segment 54 of the coolant flow passage 50. The second heat-releasing fin 22 extends towards the coolant flow passage 50 from a position on the heat-releasing surface 21b opposing the coolant flow passage 50 that passes through the second heat-generating component 24 in the perpendicular direction Z, that is, a position directly under the second heat-generating component 24. In addition, an extending tip end portion 22a of the second heat-releasing fin 22 is in contact with the heat-releasing surface 32b of the partition wall 32 with no gap therebetween. In this case, the second heat-releasing fin 22 has a standing height that is similar to the flow passage height Za of the coolant flow passage 50, in a manner similar to the first heat-releasing fin 34. Therefore, the dimension of the power conversion apparatus 1 in the perpendicular direction Z can be kept small.

The second heat-releasing fin 22 is formed into a plate shape that has a uniform plate thickness and extends along the coolant flow direction D. The second heat-releasing fin 22 functions to increase contact area (heat-release area of the heat-releasing surface 21b directly under the second heat-generating component 24) between the base plate 21 and the coolant.

In addition, in the first segment 51 and the fourth segment 54, the flow passage is narrowed by an amount equivalent to the plate thicknesses of the two second heat-releasing fins 22. Therefore, the second heat-releasing fin 22 functions to increase the flow rate of the coolant. As a result of these functions, the amount of heat released from the base plate 21 can be increased. Furthermore, the second heat-releasing fin 22 extends along the coolant flow direction D. Therefore, the second heat-releasing fin 22 functions to keep flow passage resistance applied to the coolant low. As a result of this function, the coolant can be smoothly sent while rectifying the flow. A single or a plurality of second heat-releasing fins 22 may be provided.

Figure 7:
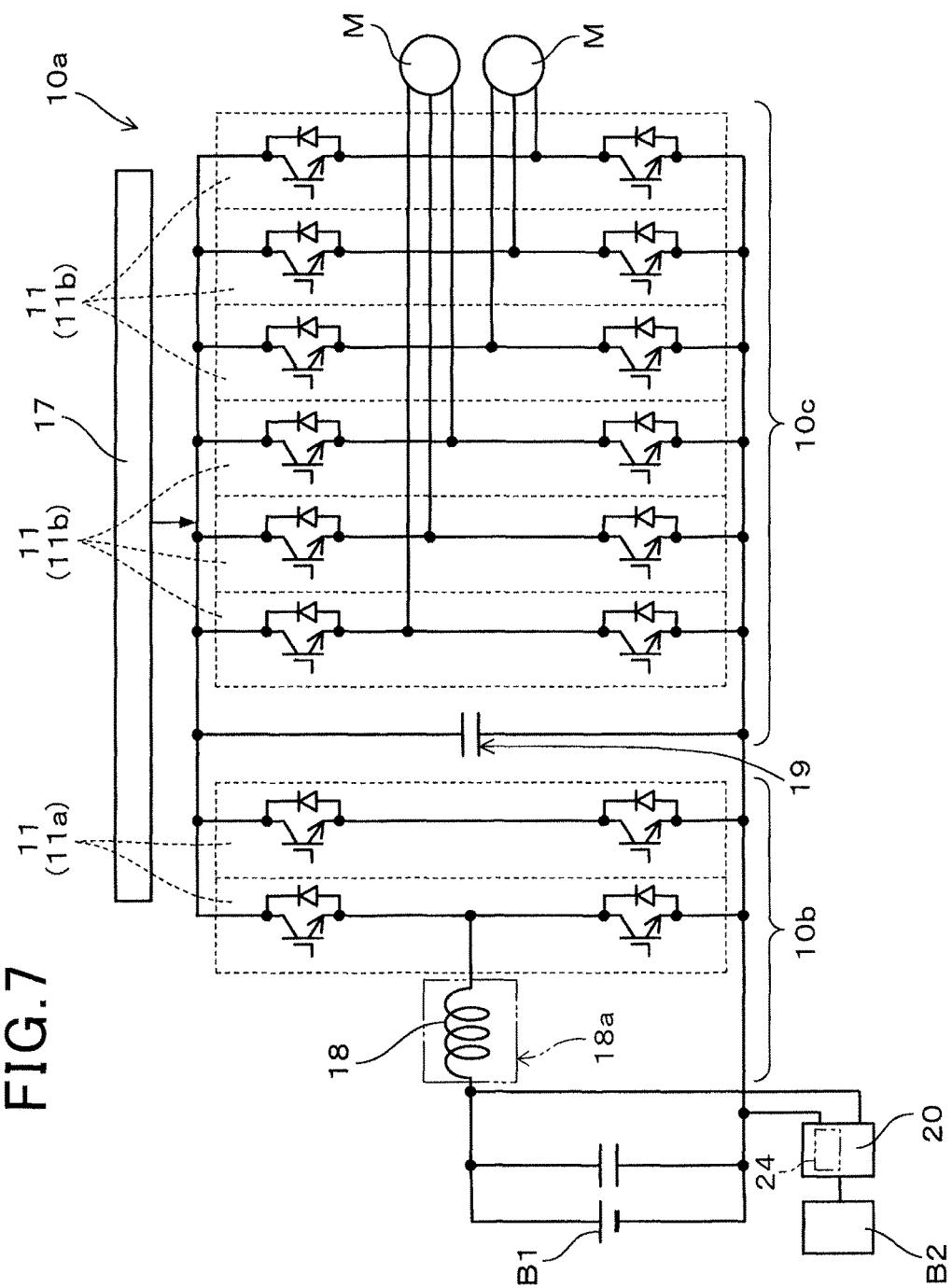
FIG. 7 is a circuit diagram of an inverter in the power conversion apparatus according to the present embodiment.

As shown in FIG. 7, the above-described inverter 10 configures the inverter circuit 10a that is a power conversion circuit that converts direct-current power supplied from a direct-current power supply B1 to alternating-current power. In the inverter circuit 10a, switching operations (ON/OFF operations) of the plurality of semiconductor modules 11 are controlled by the control circuit board 17.

According to the present embodiment, the reactor 18 and two semiconductor modules 11a configure a boosting unit 10b of the inverter circuit 10a that is the power conversion circuit. The reactor 18 is a passive element that uses an inductor. The boosting unit 10b functions to booster the voltage of the direct-current power supply B1 through switching operation (ON/OFF operation) of the semiconductor modules 11a.

Meanwhile, the capacitor 19 and six semiconductor modules 11b configure a converting unit 10c of the inverter circuit 10a that is the power conversion circuit. The converting unit 10c functions to convert the direct-current power that has been stepped up by the boosting unit 10b to alternating-current power through switching operation (ON/OFF operation) of the semiconductor modules 11b. A three-phase alternating current motor M for running a vehicle is driven by the alternating-current power obtained by the converting unit 10c.

The converter 20 is connected to the direct-current power supply B1. The converter 20 is used to step down the voltage of the direct-current power supply B1 and charge an auxiliary battery B2 that has a lower voltage than the direct-current power supply B1. The auxiliary battery B2 is used as a power supply for various apparatuses mounted in the vehicle.

Here, working effects according to the present embodiment will be described.

Figure 8:
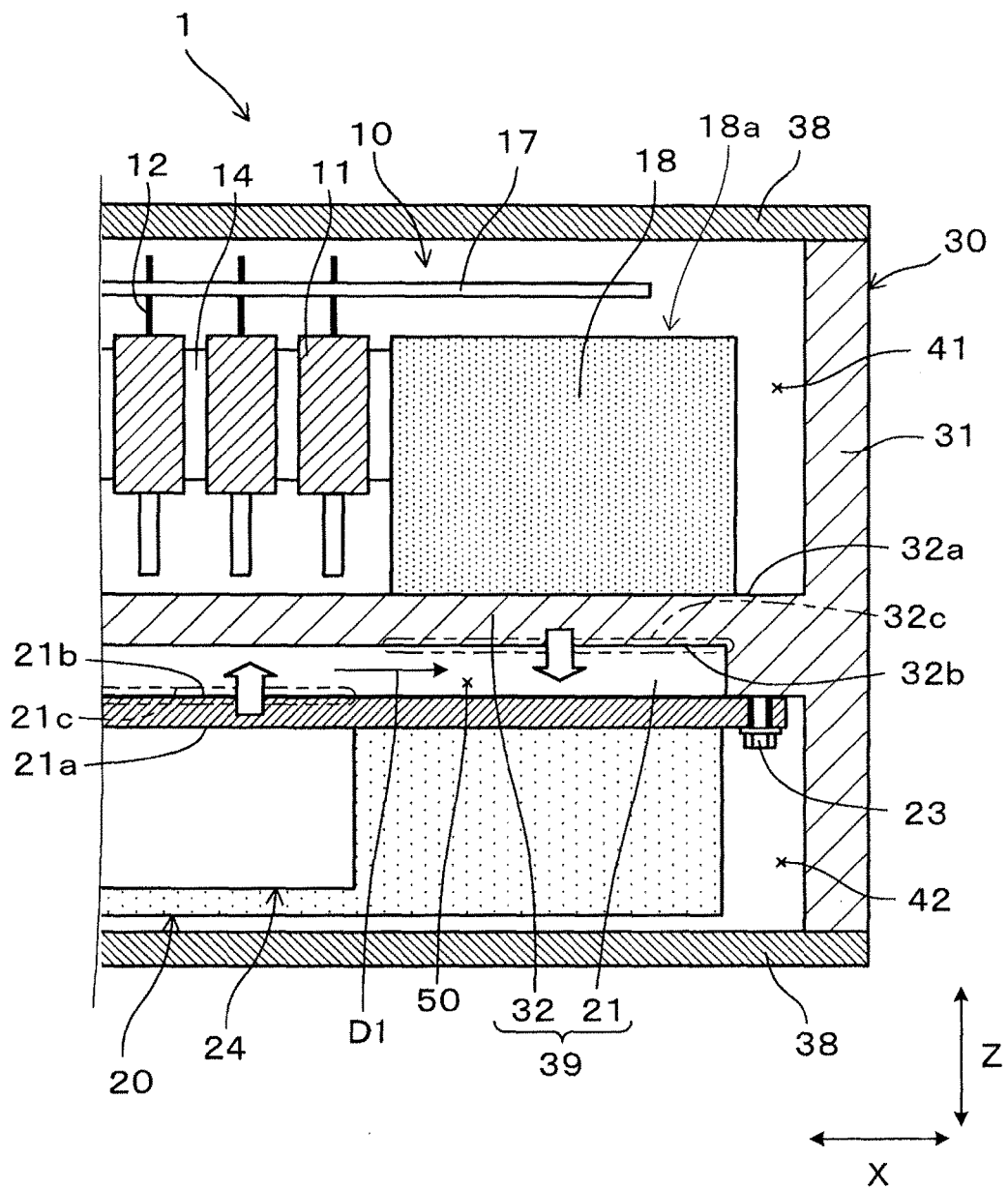
FIG. 8 is a partial, enlarged view of the periphery of the partition wall in FIG. 2.

As shown in FIG. 8, when the power conversion apparatus 1 is in an operating state, the partitioning portion 39 (the partition wall 32 and the base plate 21) is cooled by the coolant flowing through the coolant flow passage 50. Therefore, devices and air that are in contact with the partitioning portion 39 can be cooled. In addition, interference from electromagnetic noise between the inverter 10 and the converter 20 can be prevented.

Hereafter, cooling of a device that is in contact with the partitioning portion 39 will be described in detail. Heat generated by the first heat-generating component 18a of the inverter 10 is received by the heat-receiving surface 32a of the partition wall 32 that has high thermal conductivity and is released from the heat-releasing surface 32b. As a result of heat transfer from the heat-releasing surface 32b to the coolant in the coolant flow passage 50, the first heat-generating component 18a is continuously cooled. At this time, of the heat-releasing surface 32b, a high-temperature area 32c that is directly under the first heat-generating component 18a has a relatively high temperature.

In a similar manner, in the converter 20 as well, heat generated by the second heat-generating component 24 is received by the heat-receiving surface 21a of the base plate 21 that has high thermal conductivity and is released from the heat-releasing surface 21b. As a result of heat transfer from the heat-releasing surface 21b to the coolant in the coolant flow passage 50, the second heat-generating component 23 is continuously cooled. At this time, of the heat-releasing surface 21b, a high-temperature area 21c that is directly under the second heat-generating component 24 has a relatively high temperature. Therefore, in the high-temperature area 32c of the partition wall 32 and the high-temperature area 21c of the base plate 21, heat that is at a particularly high temperature flows into the coolant.

In a state such as this, should the first heat-generating component 18a and the second heat-generating component 24 be disposed so as to overlap each other in the perpendicular direction Z, heat flows into a coolant of a fixed volume in a concentrated manner, simultaneously from both sides in the perpendicular direction Z, that is, from both the high-temperature area 32c and the high-temperature area 21c. However, the amount of inflow heat that can flow into the coolant of a fixed volume at once is limited. Therefore, it is difficult to enable heat from both the high-temperature area 32c and the high-temperature area 21c to simultaneously and smoothly flow into the coolant. That is, heat transfer between heat generated by one heat-generating component and the coolant tends to be affected by heat generated in the other heat-generating component.

Therefore, according to the present embodiment, the first heat-generating component 18a and the second heat-generating component 24 are disposed so as not to overlap each other in the perpendicular direction Z. In other words, the high-temperature area 32c directly under the first heat-generating component 18a and the high-temperature area 21c directly under the second heat-generating component 24 are configured so as to be separated from each other in the coolant flow direction D. In this case, as shown in FIG. 2, a virtual line L in the perpendicular direction Z that passes through the first heat-generating component 18a passes through a position away from the second heat-generating component 24.

In the present configuration, a situation in which heat flows into a coolant of a fixed volume in a concentrated manner, simultaneously from both the high-temperature area 32c and the high-temperature area 21c, can be avoided. That is, heat flowing into a coolant of a fixed volume, simultaneously from both sides in the perpendicular direction Z, can be suppressed. For example, when the coolant flows through the coolant flow passage 50 in a coolant flow direction D1 in FIG. 8, heat interference between the high-temperature area 21c on the upstream side and the high-temperature area 32c on the downstream side does not easily occur. Consequently, cooling performances of both the inverter 10 including the first heat-generating component 18a and the converter 20 including the second heat-generating component 24 are improved.

As described above, according to the present embodiment, the respective heat-generating components 18 and 24 of the two power converters 10 and 20 are joined to the partitioning portion 39 such that the positions thereof are offset so as not to overlap each other in the perpendicular direction Z. Consequently, cooling performances of the two power converters 10 and 20 can be improved.

In addition, as a result of heat-release performance being improved and the flow rate of the coolant being increased by the first heat-releasing fins 34 and the second heat-releasing fins 22, and the flow rate of the coolant being increased by the coolant flow passage 50 being configured as a turning flow passage, cooling performances of the two power converters 10 and 20 can be further improved.

The present disclosure is not limited to the typical embodiment described above. Various applications and modifications can be considered without departing from the object of the present disclosure. For example, following embodiments to which the above-described embodiment is applied are also possible.

Figure 9:
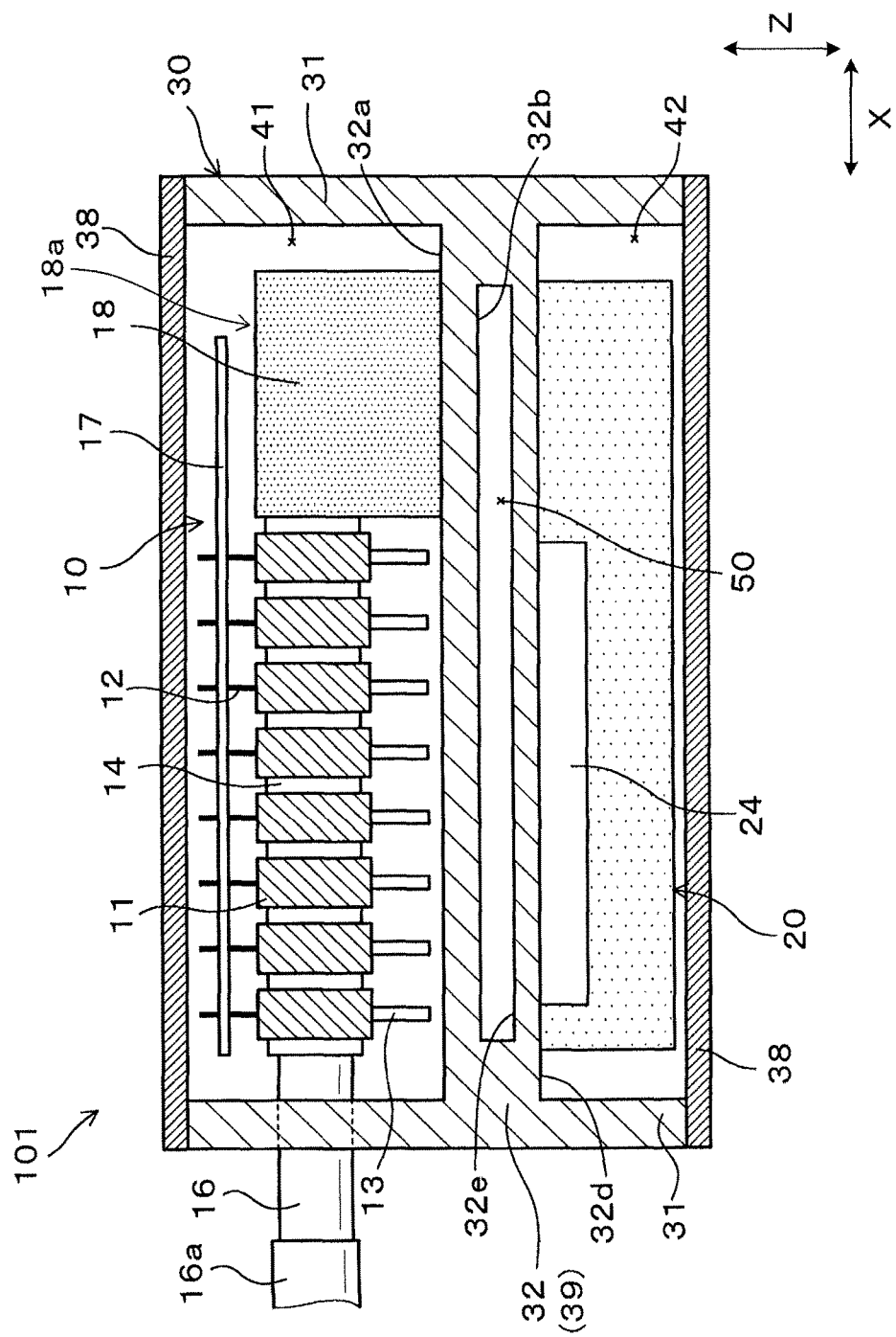
FIG. 9 is a diagram of an overview of a power conversion apparatus according to another embodiment.

According to the above-described embodiment, an example is given in which, as in the power conversion apparatus 1 shown in FIG. 2, the partitioning portion 39 is configured by the partition wall 32 of the case 30 and the base plate 21 that is a separate component from the case 30. However, the partitioning portion 39 may be configured by a single or a plurality of elements. For example, as in a power conversion apparatus 101 shown in FIG. 9, the partitioning portion 39 may be configured by the partition wall 32 of the case 30 itself. The power conversion apparatus 101 differs from the power conversion apparatus 1 in that the base plate 21 is omitted. The partition wall 32 serving as the partitioning portion 39 has a heat-receiving surface 32d and a heat-releasing surface 32e, in addition to the heat-receiving surface 32a and the heat-releasing surface 32b. The second heat-generating component 24 is joined to the heat-receiving surface 32d. The heat-releasing surface 32e partitions the coolant flow passage 50 and is in contact, at all times, with the coolant flowing through the coolant flow passage 50. Consequently, the number of components in the power conversion apparatus 101 can be reduced.

The power conversion apparatus 101 has other configurations and working effects similar to those of the power conversion apparatus 1.

Figure 10:
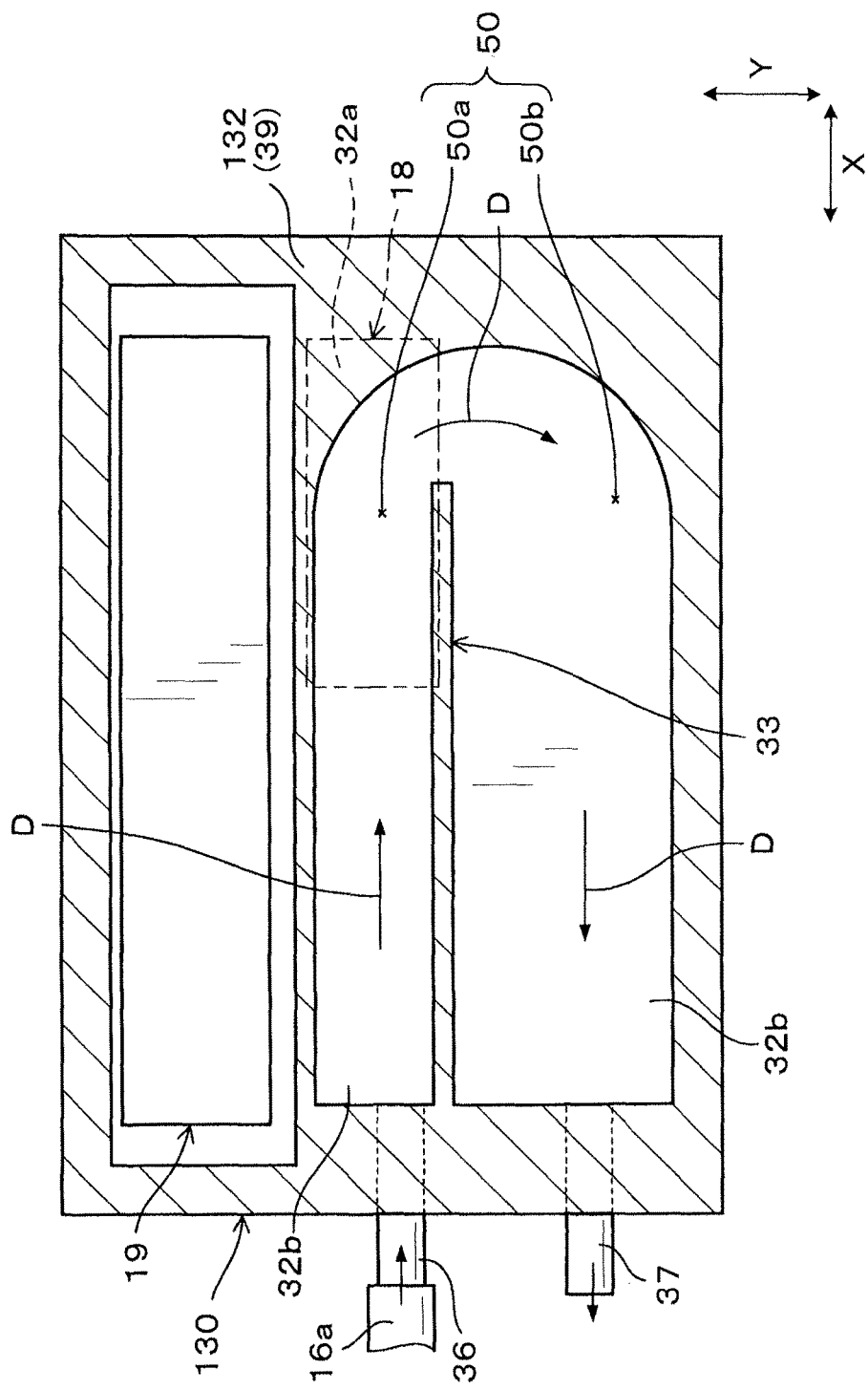
FIG. 10 is a diagram of a partition wall in a case according to another embodiment.

According to the above-described embodiment, an example is given in which the first heat-releasing fins 34 are provided in the partition wall 32 and the second heat-releasing fins 22 are provided in the base plate 21 to improve cooling performance. However, at least either of the first heat-releasing fins 34 and the second heat-releasing fins 22 can be omitted. Another embodiment in which both the first heat-releasing fins 34 and the second heat-releasing fins 22 are omitted is shown in FIGS. 10 and 11. In FIGS. 10 and 11, elements that are the same as those shown in FIG. 3 and FIG. 5 are given the same reference numbers. Descriptions of these same elements are omitted.

The partitioning portion 39 is configured by a partition wall 132 of a case 130 shown in FIG. 10 and a base plate 121 shown in FIG. 11. In the partition wall 132, the position of the standing portion 33 in the second direction Y is changed from that in FIG. 3. As a result, a flow passage cross-sectional area of the coolant flow passage 50 in an upstream-side area 50a is configured to be smaller than a flow passage cross-sectional area in a downstream-side area 50b. As a result, the flow rate of the coolant in the coolant flow passage 50 becomes higher in the upstream area 50a than the downstream area 50b.

The first heat-generating component 18a is joined at a position on the heat-receiving surface 32a of the partition wall 32 that passes through the upstream-side area 50a in the perpendicular direction Z. Meanwhile, the second heat-generating component 24 is joined at a position on the heat-receiving surface 21a of the base plate 121 that passes through the upstream-side area 50a in the perpendicular direction Z. In other words, the partition portion 39 is configured such that the flow rate of the coolant becomes relatively high in the area of the coolant flow passage 50 in which the first heat-generating component 18a and the second heat-generating component 24 overlap in the perpendicular direction Z. In the present configuration, the flow rate of the coolant can be increased without the use of heat-releasing fins.

According to the above-described embodiment, an example is given in which both the first heat-releasing fins 34 and the second heat-releasing fins 22 have a standing height that is similar to the flow passage height Za of the coolant flow passage 50. However, a configuration in which the standing height of at least either of the first heat-releasing fins 34 and the second heat-releasing fins 22 is lower than the flow passage height Za of the coolant flow passage 50 can also be used.

According to the above-described embodiment, an example is given in which a single U-turn point is present in the coolant flow passage 50. However, two or more U-turn points may be provided as required. In addition, the shape of the turning flow passage in the coolant flow passage 50 may be other than the U-shape, such as an L-shape. Furthermore, the coolant flow passage 50 may be configured to extend linearly with minimal changes in the direction of the flow passage.

According to the above-described embodiment, the reactor 18 of the inverter 10 is given as an example of the first heat-generating component 1. The transistor 25, the choke coil 26, and the filter capacitor 27 of the converter 20 is given as an example of the second heat-generating component 24. However, the first heat-generating component 18a and the second heat-generating component 24 can be variously changed, as required. For example, the capacitor 19 or a filter capacitor that removes noise current contained in the current supplied from the direct-current power supply B1 can also be the first heat-generating component 18a.

According to the above-described embodiment, an example is given in which the base plates 21 and 121 and the cases 30 and 130 are both composed of an aluminum material. However, instead of the aluminum material, another metal material or a material other than a metal material having high thermal conductivity can be used.

What is claimed is:

1. A power conversion apparatus comprising:
   a first power converter that performs power conversion;
   a second power converter that performs power conversion;
   a case that houses the first power converter and the second power converter; and
   a partitioning portion that partitions the first power converter and the second power converter housed in the case, the partitioning portion forming a coolant flow passage through which a coolant flows,
   the first power converter including a first heat-generating component, the second power converter including a second heat-generating component, the first heat-generating component and the second heat-generating component being joined to the partitioning portion at a position at which the first heat-generating component and the second heat-generating component do not overlap each other in a perpendicular direction that is perpendicular to a coolant flow direction of the coolant flow passage, wherein:
   the partitioning portion includes a first partition wall and a second partition wall that are disposed on both sides across the coolant flow passage in the perpendicular direction;
   the first partition wall includes a first heat-releasing fin that extends towards the coolant flow passage from a position on a heat-releasing surface opposing the coolant flow passage that passes through the first heat-generating component in the perpendicular direction; and
   the second partition wall includes a second heat-releasing fin that extends towards the coolant flow passage from a position on a heat-releasing surface opposing the coolant flow passage that passes through the second heat-generating component in the perpendicular direction.

2. The power conversion apparatus according to claim 1, wherein:
   the first heat-releasing fin and the second heat-releasing fin are each formed into a plate shape that has a uniform plate thickness and extends along the coolant flow direction in the coolant flow passage.

3. The power conversion apparatus according to claim 2, wherein:
   an extending tip end portion of the first heat-releasing fin is in contact with the heat-releasing surface of the second partition wall, and an extending tip end portion of the second heat-releasing fin is in contact with the heat-releasing surface of the first partition wall.

4. The power conversion apparatus according to claim 3, wherein:
   the coolant flow passage in the partitioning portion is a turning flow passage configured such that a direction of the flow passage changes.

5. The power conversion apparatus according to claim 1, wherein:
   the partitioning portion is configured such that a flow rate of the coolant is relatively high in an area of the coolant flow passage in which the first heat-generating component and the second heat-generating component overlap in the perpendicular direction.

6. The power conversion apparatus according to claim 1, wherein:
   an extending tip end portion of the first heat-releasing fin is in contact with the heat-releasing surface of the second partition wall, and an extending tip end portion of the second heat-releasing fin is in contact with the heat-releasing surface of the first partition wall.

7. The power conversion apparatus according to claim 1, wherein:
   the coolant flow passage in the partitioning portion is a turning flow passage configured such that a direction of the flow passage changes.

8. The power conversion apparatus according to claim 1, wherein:
   the coolant flow passage in the partitioning portion is a turning flow passage configured such that a direction of the flow passage changes.

9. The power conversion apparatus according to claim 2, wherein:
   the coolant flow passage in the partitioning portion is a turning flow passage configured such that a direction of the flow passage changes.

* * * * *